United States Patent [19]

Ward et al.

[11] 4,390,674

[45] Jun. 28, 1983

[54] UNIAXIALLY DRAWN VINYLIDENE FLUORIDE POLYMERS

[75] Inventors: Ian M. Ward, Bramhope; John C. McGrath, Surbiton, both of England

[73] Assignee: National Research Development Corporation, London, England

[21] Appl. No.: 285,121

[22] PCT Filed: Dec. 1, 1980

[86] PCT No.: PCT/GB80/00207

§ 371 Date: Jul. 21, 1981

§ 102(e) Date: Jul. 21, 1981

[87] PCT Pub. No.: WO81/01567

PCT Pub. Date: Jun. 11, 1981

[30] Foreign Application Priority Data

Nov. 30, 1979 [GB] United Kingdom ............... 7941419

[51] Int. Cl.³ .................... B32B 27/16; B29C 17/02; H01L 41/16
[52] U.S. Cl. .................................... 526/255; 264/22; 428/339; 428/421; 428/910; 528/502
[58] Field of Search ............... 428/910, 421, 422, 339; 264/22, 24; 526/255

[56] References Cited

U.S. PATENT DOCUMENTS

| 3,798,473 | 3/1974 | Murayama et al. | 310/8.2 |
| 3,878,274 | 4/1975 | Murayama et al. | 264/24 |
| 3,925,339 | 12/1975 | Ishii et al. | 526/255 |
| 4,241,128 | 12/1980 | Wang | 264/22 |
| 4,298,719 | 11/1981 | Mizuno et al. | 428/421 |
| 4,308,370 | 12/1981 | Fukada et al. | 264/22 |

FOREIGN PATENT DOCUMENTS 1173688 12/1969 United Kingdom.

OTHER PUBLICATIONS

*Chemical Abstracts*, vol. 87, No. 10, Sep. 5, 1977, p. 641, abstract No. 87:77463g Niguchi et al., "Piezoelectric Polymer Films".

*Primary Examiner*—William J. Van Balen
*Attorney, Agent, or Firm*—Finnegan, Henderson, Farabow, Garrett & Dunner

[57] ABSTRACT

An elongated material comprising a vinylidene fluoride polymer and having a Young's modulus from 3 to 15 GPa and which, when poled, has a pyroelectric constant from 4 to 15 nC cm$^{-2}$K$^{-1}$, or a hydrostatic piezoelectric constant greater than 10 pCN$^{-1}$.

10 Claims, No Drawings

UNIAXIALLY DRAWN VINYLIDENE FLUORIDE POLYMERS

This invention relates to vinylidene fluoride polymers and in particular to such polymers having improved pyroelectric and piezoelectric properties.

It is known that vinylidene fluoride polymers can be polarised by subjecting them to an intense electric field to yield material having permanent pyroelectric and/or piezoelectric properties which can be utilised in certain electronic applications. Such a procedure is often referred to as "poling".

It is known that vinylidene fluoride polymers can exist in at least two distinct crystalline forms, known as Form I ($\beta$) and Form II ($\alpha$). These phases are readily distinguished by analysis of their X-ray diffraction patterns, and such measurements also provide an indication of the proportion of Form I material within a sample. Studies of this kind have shown that for a given applied polarizing field both the piezo- and pyroelectric properties are enhanced the greater the proportion of Form I material present. It has been previously accepted that the relative proportions of Form I and Form II materials are affected by temperature and that in order to achieve a high proportion of Form I material, relatively low temperatures (e.g. below 80° C.) should be maintained.

Hitherto it has only been possible to prepare materials having a pyroelectric constant typically no greater than about 3 nC cm$^{-2}$K$^{-1}$ and a hydrostatic piezoelectric constant, $d_h$, typically no greater than about 9 pCN$^{-1}$.

It is therefore an object of the present invention to provide vinylidene fluoride polymers having improved pyroelectric and piezoelectric properties.

According to one aspect of the invention, we provide an elongated material of a vinylidene fluoride polymer, particularly a polyvinylidene fluoride, the material having a Young's modulus from 3 to 15, typically from 4 to 10, suitably from 5 to 8 GPa.

The Young's modulus of the elongated material is determined at 21° C. by a dead-loading creep experiment, as described by Gupta & Ward in J. Macromol. Sci. Phys. B1, 373 (1967), taking the 10 second response at a strain of 0.1%.

According to a further aspect of the invention, there is provided an elongated material as hereinabove defined which, on poling, as hereinabove defined, has a pyroelectric constant of at least 4, for example, from 4 to 15, typically from 4 to 10, suitably from 5 to 8 nC cm$^{-2}$K$^{-1}$.

According to another aspect of the invention, there is provided an elongated material as hereinabove defined which on poling, as hereinabove defined, has a hydrostatic piezoelectric constant greater than 10 pCN$^{-1}$, suitably greater than 12 pCN$^{-1}$, preferably greater than 16 pCN$^{-1}$.

Poling may be carried out at an elevated temperature up to 130° C., for example at 100° C., but may also be carried out at lower temperatures, for example room temperature. Typically, the electric field applied will range from 100 to 500 Volt/micron, more intense fields being required at lower temperatures. The field is applied across the thickness of the polymer sample by corona discharge needle electrodes, by smooth flat conductive plates or by electrodes deposited on the sample itself.

The elongated material may exhibit an X-ray diffraction pattern which, after poling, indicates the presence of at least 70%, and preferably at least 80%, by volume of the total crystalline material of Form I material. The percentage of Form I material in the elongated material is determined as a proportion of the total crystalline material present by comparing the intensities of the Form I (310) and (020) reflections and the Form II (021) and (111) reflections. Appropriate corrections are made for the structure factors and angle factors: see Hasegawa et al: Polymer J. 3, p,600 (1972).

The crystallinity of the elongated material will depend on several factors including molecular weight and previous thermal history. However, it is generally found to be from 30% to 50%, usually from 35% to 45% by volume of the total elongated material.

The pyroelectric constant of the poled elongated material is determined by subjecting the unclamped sample to a linear temperature "ramp" of 0.2° per second over the interval 10°–30° C. The "short-circuit" reversible polarisation current per unit area of electrode per unit rate of temperature rise is the pyroelectric coefficient.

The hydrostatic piezoelectric constant of the poled elongated material is determined by immersing the electroded sample in oil of high resistivity and subjecting it to a pressure "step" of 2 atmospheres supplied by compressed air above the oil surface. The piezoelectric charge generated per unit electrode area per unit pressure is the piezoelectric constant. This charge is stored on the feedback capacitor of the measurement electronics to give zero field in the piezoelectric sample. In this disclosure, no correction for the adiabatic heating of the immersion fluid has been made.

This invention also provides a process for the preparation of an elongated material of a vinylidene fluoride polymer, particularly a polyvinylidene fluoride, which process comprises drawing a material of a vinylidene fluoride polymer, at an elevated temperature such as from 110° C. to 170° C., suitably from 120° C. to 160° C., preferably from 130° C. to 150° C., to a draw ratio of at least 4:1, suitably from 4:1 to 20:1, typically 5:1 to 15:1, suitably 6:1 to 10:1. The drawing may be carried out in more than one stage and is advantageously effected at the maximum rate possible without incidence of tensile failure.

The draw ratio is defined as the ratio of cross-sectional area of a body of the polymer before and after the drawing.

Particularly successful materials, yielding advantageous pyro and piezo electric properties, have been prepared by the process of this invention using tape extruded from polyvinylidene fluoride having a number average molecular weight ($\overline{M}_n$) from 1.0 to 1.9×10$^5$, preferably from 1.3 to 1.8×10$^5$, and a weight average molecular weight ($\overline{M}_w$) from 2×10$^5$ to 8×10$^5$. Examples include "Kynar" calendered film grade 200 (ex Pennwalt Chem. Ind.: $\overline{M}_n$ 1.71×10$^5$ $\overline{M}_w$ 7.64×10$^5$); "Solef" XION extruded sheet ($\overline{M}_n$ 1.71×10$^5$ $\overline{M}_w$ 3.51×10$^5$) and "Solef" X8N pellets ($\overline{M}_n$ 1.3×10$^5$ $\overline{M}_w$ 2.76×10$^5$), both ex Solvay et cie. The SOLEF XION commercial grade was found to be particularly useful, its chain structure was determined in accordance with the method of Wilson and Santee (J. Polymer Sci. C8, p. 97, 1965). The 56.4 Mc/s F$^{19}$ spectrum obtained from a 10% solution in N,N-dimethylacetamide showed peaks listed by Wilson and Santee with intensities A 90.4%, B 3.3%, C 2.9%, D 3.4%.

It may be advantageous to subject the vinylidene fluoride polymer material prior to drawing to a thermal treatment. For example, a sheet of compression moulded, extruded or extruded and subsequently compression moulded material may be allowed to cool slowly, for example at 1° to 5° C. min$^{-1}$, from above the crystalline melting point (160° C. for the "Kynar" grade; 178° C. for the "Solef" grades) to ambient temperature; to cool, the rate not being critical, to a temperature (for example from 160° C. to 130° C.) below the crystalline melting point where it is maintained until crystallization is established and then quenched to ambient temperature; or may immediately be quenched to ambient temperature. The material may also be treated (heat set) after drawing by maintaining the drawn tape at a constant length and temperature (typically at the draw temperature or above).

The materials produced in this invention may typically have a thickness in the range 20 μm, typically 25 μm to 1500 μm, although the invention is not limited to materials in this range. The materials may be produced in the form of a sheet or foil typically 1 to 2 cms in width, although samples of up to 12 cms in width have been prepared.

Since the materials produced have particularly beneficial pyroelectric and piezoelectric properties they can be used in a wide range of applications. In particular films of the improved polymer can be used within the probes of ultrasonic scanners and especially ultrasonic medical scanners. They may also be used as sensing elements in infra red imaging or sensing devices or alternatively in ultrasonic imaging devices in which the polymer serves as the piezoelectric element in a Sokolov tube. Other applications include security devices (e.g. heat or pressure sensitive intruder or anti-theft devices, fire alarms, signature recognition devices); a range of strain gauges (e.g. diaphragm gauges, barrel gauges, shear transducers); deformation monitors for use with large structures such as bridges; pressure sensitive devices (e.g. traffic flow counters and monitors, touch and pressure wave switches, instrument key board devices, automatic machine control devices); seismic wave detectors; weighing devices, and a variety of hydrophones.

The following Examples illustrate the invention.

EXAMPLE 1

An isotropic sheet of thickness 0.6 mm was prepared by compression moulding 5 mm sheet of Solvay SOLEF XION polyvinylidene fluoride at 240° C. for 80 min and then quenching the sheet in water at room temperature. From this sheet a dumb-bell sample was cut of 3 cm width and 3.5 cm gauge length. This was drawn uniaxially at 140° C. in an Instron tensile testing machine in two stages: (1) at a cross-head speed of 0.2 cm/min to the limit of travel in the Instron oven, which gave a first stage draw ratio of 5.9; (2) the centre region of the draw material was cut out and redrawn at a drawing rate of 0.05 cm/min to a total draw ratio of 6.46. X-ray characterisation of the sample, according to the method described, showed the Form I content was not less than 80%. The Young's modulus of the sample was 3.8 GPa.

The sample was poled using 100 V/μ at 100° C. for 30 min with the field applied. Electrodes were applied by spraying a suspension of colloidal silver on to the surfaces of the film.

The pyroelectric constant of the drawn film was determined to be 4.5 nC/cm$^2$/°K and the hydrostatic piezoelectric constant was determined to be 15 pC/N.

EXAMPLE 2

Example 1 was repeated, save that the second stage drawing was effected to a total draw ratio of 6.24 giving a Form I content of not less than 80%. The Young's modulus, pyroelectric constant and hydrostatic piezoelectric constant were, respectively, 4.6 GPa, 4.0 nC/cm$^2$/°K and 13.75 pC/N.

EXAMPLE 3

From a sheet of material similar to that used in Example 1, but of thickness 0.3 mm, was cut a dumb-bell sample of 8 cm width and 16 cm gauge length. This sample was uniaxially drawn at 160° at a drawing rate of 3 cm/min. to a first stage draw ratio of 4:1 and then a portion of this material was re-drawn at 160° C. at a drawing rate of 0.3 cm/min. to a total draw ratio of 14:1. The Young's modulus was 4.9 GPa.

The sample was poled at room temperature using a field of 456 V/micron and had a pyroelectric constant of 3.85 nC/cm$^2$/°K and a hydrostatic piezoelectric constant of 12 pC/N. The poled sample had a Form I content of about 50%.

EXAMPLE 4

An isotropic sheet of Kynar polyvinylidene fluoride was prepared by compression moulding six 0.2 mm layers of the as-received film between copper plates at 230° C. for 1 hour; each sheet was laid with the machine direction at right angles to the one below it. The moulded sheet was allowed to cool slowly to 140° C. and then quenched in water at room temperature. From this sheet a dumb-bell sample of gauge length 2.22 cm, 0.47 cm wide and approximately 0.06 cm thick was cut using a standard die. The sample was drawn uniaxially at a temperature of 140° C. in a three stage process in which the draw rate was 10 cm min$^{-1}$, 0.2 cm min$^{-1}$ and 0.05 cm min$^{-1}$, respectively.

A total draw ratio of 7.3 was obtained. The Young's modulus of the sample was 4.31 GPa.

EXAMPLE 5

An isotropic sheet of Kynar polyvinylidene fluoride was prepared essentially as in Example 4, save that the moulded sheet was immediately quenched in water at room temperature. A dumb-bell sample, prepared as in Example 4, was drawn uniaxially at 120° C. in a two stage process in which the draw rate was 0.2 cm min$^{-1}$ and 0.05 cm min$^{-1}$, respectively.

A total draw ratio of 6.6 was obtained. The Young's modulus of the sample was 4.14 GPa.

EXAMPLE 6

An isotropic sheet of Solef XION was prepared essentially as in Example 1, save that the moulded sheet was cooled slowly at room temperature. A dumb-bell sample, prepared as in Example 4, was drawn uniaxially at 140° C. in a single stage process in which the draw rate was 0.2 cm min$^{-4}$.

A draw ratio of 6.7 was obtained. The Young's modulus of the sample was 4.19 GPa.

EXAMPLE 7

An isotropic sheet of Solef X8N was prepared by compression moulding pellets at 210° C. for about one hour and immediately quenching the moulded sheet in water at room temperature. A dumb-bell sample, prepared as in Example 4, was drawn uniaxially at 140° C. in a two stage process in which the draw rate was 10 cm min$^{-1}$ for 1.4 min and 0.02 cm min$^{-1}$ for 5 min.

A total draw ratio of 6.5 was obtained. The Young's modulus of the sample was 3.77 GPa.

We claim:

1. A process for the preparation of a piezoelectric, pyroelectric polyvinylidene fluoride polymer material having a Young's modulus of from 3 to 15 GPa comprising uniaxially drawing in one direction only a sheet of polyvinylidene fluoride at a temperature of from 110° C. to 170° C. to a draw ratio of at least 6 to 1 and poling the drawn sheet by applying an electric field across its thickness to effect its polarization.

2. The process of claim 1, wherein the drawing is done at a temperature of from 130° C. to 150° C.

3. The process of claim 1, wherein the draw ratio is from 6 to 1 to 10 to 1.

4. The process of claim 1, wherein the electric field applied is from 100 to 500 volt/micron.

5. The process of claim 1, wherein the uniaxial drawing is done in one direction only but in at least two stages to achieve a total draw ratio of at least 6 to 1.

6. A polyvinylidene fluoride polymer sheet that is uniaxially stretched in one direction and has a Young's modulus of 3 to 15 GPa, a pyroelectric constant of from 4 to 15 nC cm-2K-1 and a hydrostatic piezoelectric constant greater than 10 pCN-1 produced by uniaxially drawing in one direction only a sheet of polyvinylidene fluoride at a temperature of from 110° C. to 170° C. to a draw ratio of at least 6 to 1 and poling the drawn sheet by applying an electric field across its thickness to effect its polarization.

7. The sheet of claim 6 having a pyroelectric constant of from 4 to 10 nC cm-2K-1.

8. The sheet of claim 6 having a hydrostatic piezoelectric constant greater than 16 pCN-1.

9. The sheet of claim 6, which has a Young's modulus of from 3 to 10 GPa.

10. The sheet of claim 6, wherein at least 70% by volume of the total crystalline material is Form I material.

* * * * *